US009269404B1

(12) United States Patent  (10) Patent No.: US 9,269,404 B1
Moran  (45) Date of Patent: Feb. 23, 2016

(54) SEMICONDUCTOR PACKAGE ON PACKAGE MEMORY CHANNELS WITH ARBITRATION FOR SHARED CALIBRATION RESOURCES

(71) Applicant: QUALCOMM Incorporated, San Diego, CA (US)

(72) Inventor: Patrick Bartholomew Moran, La Jolla, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 72 days.

(21) Appl. No.: 14/454,622

(22) Filed: Aug. 7, 2014

(51) Int. Cl.
*G11C 5/04* (2006.01)
*G11C 7/10* (2006.01)
*G11C 7/22* (2006.01)
*G11C 5/06* (2006.01)
*G11C 7/12* (2006.01)

(52) U.S. Cl.
CPC *G11C 5/04* (2013.01); *G11C 5/066* (2013.01); *G11C 7/1072* (2013.01); *G11C 7/1075* (2013.01); *G11C 7/12* (2013.01); *G11C 7/22* (2013.01)

(58) Field of Classification Search
CPC ............ G11C 5/04; G11C 5/066; G11C 7/12; G11C 7/14; G11C 7/22; G06F 13/122; G06F 13/14; G06F 13/36; G06F 13/364
See application file for complete search history.

(56) References Cited

U.S. PATENT DOCUMENTS

| 7,432,731 B2 | 10/2008 | Bains et al. |
| 7,888,948 B2 | 2/2011 | Jakobs |
| 7,902,858 B2 | 3/2011 | Kuwahara et al. |
| 7,990,174 B2 | 8/2011 | Park |
| 8,446,789 B2 | 5/2013 | Jeong |
| 2011/0119439 A1* | 5/2011 | Blackmon ........ G11C 11/40611 711/105 |
| 2015/0340069 A1* | 11/2015 | Arai .......................... G11C 7/04 326/30 |

OTHER PUBLICATIONS

Altera Corporation: "DDR3 SDRAM Interface Termination and Layout Guidelines", May 2009, pp. 1-33.

* cited by examiner

*Primary Examiner* — Hal Schnee
(74) *Attorney, Agent, or Firm* — Seyfarth Shaw LLP

(57) ABSTRACT

A package on package (PoP) apparatus includes a shared ZQ calibration path and a shared ZQ calibration resistor for calibrating multiple channels of DRAM on a memory package of the PoP apparatus. Arbitration circuitry on a processor package of the PoP apparatus is coupled to separate memory controllers for the multiple memory channels. The arbitration circuitry is configured to indicate availability of the shared ZQ calibration resistor. The memory controllers are configured to communicate with the arbitration circuitry before performing a ZQ calibration and to delay the ZQ calibration when the arbitration circuitry indicates the ZQ calibration resistor is busy.

20 Claims, 5 Drawing Sheets

SEMICONDUCTOR PACKAGE ON PACKAGE MEMORY CHANNELS WITH ARBITRATION FOR SHARED CALIBRATION RESOURCES

TECHNICAL FIELD

The present disclosure relates generally to semiconductor packaging and calibration. More specifically, the present disclosure relates to sharing external calibration resources between multiple channels on a semiconductor package on package apparatus.

BACKGROUND

Numerous semiconductor packaging methods facilitate increased scaling of circuitry and reduce the size and cost of electronic systems for products such as mobile phones, tablets and other mobile computing devices. For example, package on package (PoP) is a semiconductor packaging method that is commonly used to reduce the area of printed circuit boards that support multiple semiconductor packages in a mobile device. PoP involves stacking of multiple ball grid array (BGA) packages in which a bottom BGA package is coupled to a printed circuit board, and one or more top BGA packages are coupled to the bottom BGA package. The bottom BGA package may be a processor package, such as a system on a chip (SoC) package for a mobile device. The top package may be a memory package such as a mobile dynamic random access memory (DRAM) package coupled to the SoC in the bottom package. The mobile DRAM may include one or more independently accessible system channels.

SUMMARY

A semiconductor package on package (PoP) apparatus may include a first package including a first memory controller and a second memory controller, and a second package coupled to the first package. The second package may also include a first system memory channel and a second system memory channel. A calibration resistor is coupled to the first memory channel and the second memory channel via a conductive path through the first package. Arbitration circuitry on the first package is coupled to the first memory controller and the second memory controller. The arbitration circuitry is configured to prevent calibration signals of the first memory controller from overlapping calibration signals of the second memory controller.

A method for sharing calibration circuitry in a package on package (PoP) device may include receiving a ZQ request command from a first memory controller, determining whether another memory controller is using a ZQ resource, and granting permission to use the ZQ resource when the other memory is not using the ZQ resource. The method also includes denying permission to use the ZQ resource when the other memory is using the ZQ resource.

A semiconductor package on package (PoP) apparatus may also include a first package and a second package coupled to the first package. The first package includes a first memory controller and a second memory controller. The second package including a first system memory channel and a second system memory channel. A calibration resistor is coupled to the first memory channel and the second memory channel via a conductive path through the first package. The apparatus may also include means for preventing calibration signals of the first memory controller from overlapping calibration signals of the second memory controller.

A computer program product for wireless communications in a wireless network includes a non-transitory computer-readable medium having program code recorded thereon. The program code includes program code to receive a ZQ request command from a first memory controller, program code to determine whether another memory controller is using a ZQ resource, and program code to grant permission to use the ZQ resource when the other memory is not using the ZQ resource. According to an aspect of the present disclosure, the program code also includes program code to deny the permission to use the ZQ resource when the other memory is using the ZQ resource.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Low power double data rate type three (LPDDR3) is a DRAM interface specification. In LPDDR3, a calibration process called "ZQ calibration" is defined to calibrate the DRAM's output drivers. A memory controller coupled to the DRAM can initiate a ZQ calibration process at various times to account for changes in the system environment. ZQ calibration involves coupling an external precision resistor called a ZQ resistor between a dedicated ZQ calibration path of a DRAM package and an external node such as a ground node or a positive voltage value. For example, the dedicated ZQ path includes a dedicated ZQ ball or dedicated ZQ pin on the DRAM package.

Because the available area for bottom-side balls on a processor package is limited, it is desirable to limit the number of ZQ balls at the bottom conductive interface between the processor package and the system PCB. According to an aspect of the present disclosure, a bottom package includes arbitration circuitry configured to allow only one of the ZQ calibration paths to be coupled to a shared bottom conductive interface at a time.

A conventional package on package (PoP) apparatus includes dynamic random access memory (DRAM) in a top package. ZQ calibration paths couple the DRAM to corresponding external ZQ resistors on a system printed circuit board (PCB). The ZQ calibration paths conventionally extend from one or more DRAM dies in the top package through a bottom package of the PoP apparatus to the system PCB 112 where they are coupled to the external ZQ resistors on the system PCB. The bottom package includes a processor system, coupled to the DRAM in the top package.

The conventional PoP apparatus may include multiple system memory channels coupled between DRAM on a top package of the PoP and the bottom package of the PoP. A first system memory channel is coupled to a first portion of the DRAM and a second system memory channel is coupled to a second portion of the DRAM in the top package of the PoP. The first portion and the second portion may be separate DRAM dies, for example. A first system memory channel is coupled to a first memory controller in the bottom package, and a second system memory channel is coupled to a second memory controller in the bottom package, for example.

Conventionally, at least one ZQ calibration path for each system memory channel extends from the DRAM in a top package of the PoP apparatus through the bottom package of the PoP to a corresponding external ZQ resistor on the system PCB. Each ZQ calibration path includes a top conductive interface, such as a solder ball coupled between the top package and bottom package and a bottom conductive interface, such as a solder ball coupled between the bottom package and the system PCB. Because each system memory channel conventionally involves a corresponding ZQ calibration path, the implementation of multiple system memory channels in a PoP apparatus involves an additional top conductive interface coupled between the top package and bottom package, and an additional bottom conductive interface coupled between the bottom package and the system PCB for each additional system memory channel.

Conventionally, for each of the system memory channels in a PoP, one or more ZQ balls are provided at the top conductive interface of the bottom package. In addition, corresponding dedicated ZQ balls are provided at the bottom conductive interface of the bottom package. Each ZQ ball at the bottom conductive interface conventionally couples a system memory channel to a corresponding external ZQ resistor on the system PCB. Currently available semiconductor packages for mobile devices allocate two or four external ZQ resistors on a system PCB and two or four ZQ balls at the bottom conductive interface of the bottom package to accommodate four ZQ calibration paths for two system memory channels.

Because the available area for bottom-side balls on a processor package is limited, it is desirable to limit the number of ZQ balls at the bottom conductive interface between the processor package and the system PCB.

Figure 1:
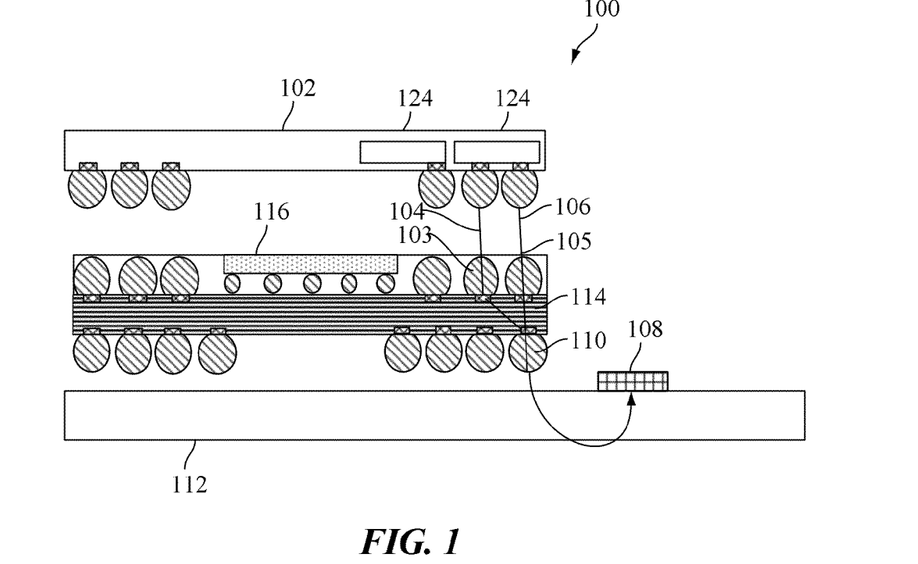
FIG. 1 is a diagram conceptually illustrating a general example of ZQ calibration paths in a package on package apparatus according to aspects of the present disclosure.

FIG. 1 is a block diagram illustrating a package on package (PoP) apparatus 100 according to an aspect of the present disclosure. In this configuration, the PoP apparatus 100 includes a memory device 124 (e.g., dynamic random access memory (DRAM)) in a top package 102, and a first ZQ calibration path 104 and a second ZQ calibration path 106 that couple the memory device 124 to a shared external ZQ resistor 108 on a system printed circuit board (PCB) 112. The first ZQ calibration path 104 and the second ZQ calibration path 106 extend from one or more memory dies in the top package 102 to a bottom package 114 of the PoP 100. A shared bottom conductive interface 110 couples a selected one of the first ZQ calibration path 104 and the second ZQ calibration path 106 to the system PCB 112 and to a shared external ZQ resistor 108 on the system PCB 112. The bottom package 114 includes a processor system 116, coupled to the DRAM in the top package 102. The processor system 116 may include an MSM series processor or an APQ series processor by Qualcomm Incorporated, of San Diego, Calif., for example.

Figure 2:
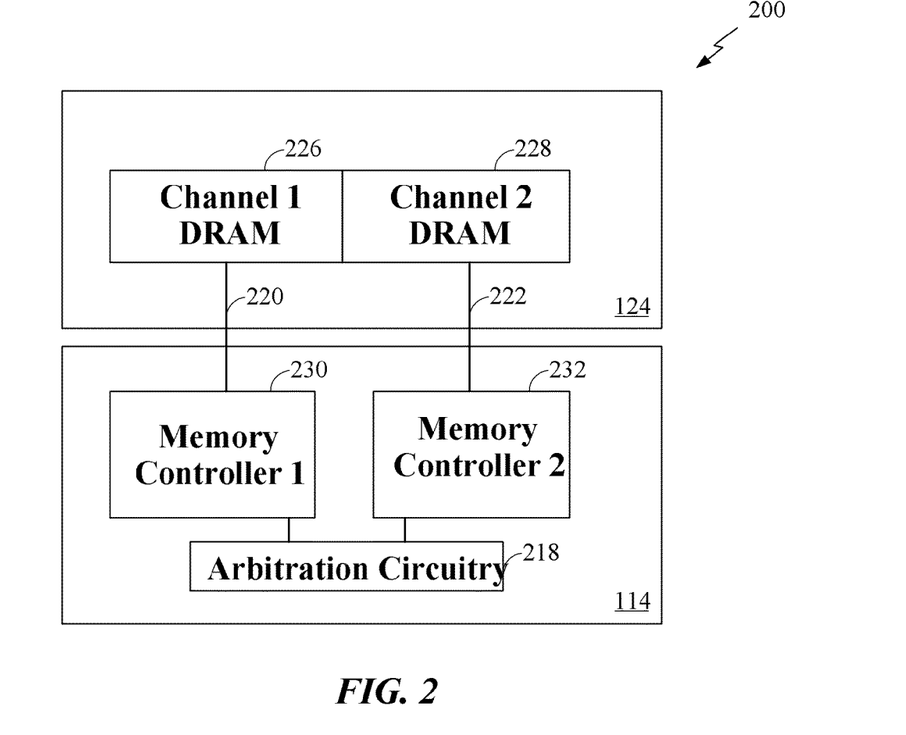
FIG. 2 is a block diagram conceptually illustrating a package on package apparatus including multiple memory channels and ZQ arbitration circuitry according to aspects of the present disclosure.

FIG. 2 is a block diagram 200 further illustrating the PoP apparatus 100 of FIG. 1, including multiple memory channels and ZQ arbitration circuitry according to aspects of the present disclosure. According to an aspect of the present disclosure, a bottom package 114 of the PoP apparatus 100 includes arbitration circuitry 218 that is configured to allow only one of the first ZQ calibration path 104 or the second ZQ calibration path 106 (FIG. 1) from being coupled to a shared bottom conductive interface 110 (FIG. 1) at a time.

In this configuration, the PoP apparatus 100 includes a first system memory channel 220 and a second system memory channel 222 coupled between a memory device 124 on a top package 102 (FIG. 1) of the PoP apparatus 100 and the bottom package 114 of the PoP apparatus 100. The first system memory channel 220 is coupled to a first portion 226 of the memory device 124 and the second system memory channel 222 is coupled to a second portion 228 of the memory device 124 on the top package 102 (FIG. 1) of the PoP apparatus 100. In one example, the first portion 226 and the second portion 228 are separate memory dies. The first system memory channel 220 is coupled to a first memory controller 230 in the bottom package 114, and the second system memory channel 222 is coupled to a second memory controller 232 in the bottom package 114.

Referring FIGS. 1 and 2, at least one of the first ZQ calibration path 104 and the second ZQ calibration path 106 for the first system memory channel 220 and the second system memory channel 222, respectively, extends from the memory device 124 in the top package 102 of the PoP apparatus 100 to the bottom package 114 of the PoP apparatus 100. Each of the first ZQ calibration path 104 and the second ZQ calibration path 106 includes a top conductive interface 103, 105 such as a solder ball coupled between the top package 102 and the bottom package 114. A shared bottom conductive interface 110, such as a solder ball between the bottom package 114 and the system PCB 112, couples only one of the first ZQ calibration path 104 or the second ZQ calibration path 106 at a time to a shared external ZQ resistor 108 on the system PCB 112.

According to one aspect of the present disclosure, the implementation of first system memory channel 220 and the second system memory channel 222 in the PoP apparatus 100 involves a top conductive interface 103, 105 coupled between the top package 102 and bottom package 114 for each additional memory channel, but involves only a single one of the shared bottom conductive interface 110 coupled between the bottom package 114 and the system PCB 112.

According to an aspect of the present disclosure, for each of the first system memory channel 220 and the second system memory channel 222 that are expected to be used in the PoP apparatus 100, a dedicated ZQ ball is provided at the top conductive interface 103, 105 of the bottom package 114. A shared ZQ ball is provided at the shared bottom conductive interface 110 of the bottom package 114. The shared ZQ ball at the shared bottom conductive interface 110 couples one of the first system memory channel 220 and the second system memory channel 222 at a time to a shared external ZQ resistor 108 on the system PCB 112. Thus, according to aspects of the present disclosure, the number of ZQ balls at the shared bottom conductive interface 110 is less than the number of dedicated ZQ balls at the top conductive interface 103, 105.

According to aspects of the present disclosure, the number of ZQ balls to accommodate multiple system memory channels in a PoP apparatus is reduced. The shared bottom conductive interface 110 supports multiple ZQ calibration paths to facilitate a reduction in bottom side ZQ balls between a bottom package 114 of the PoP apparatus 100 and a system PCB 112. According to aspects of the present disclosure, the number of ZQ balls on the bottom of the bottom package 114 in the PoP apparatus 100 and the number of the shared external ZQ resistor 108 on the system PCB 112 can be reduced by a factor of 1/s, compared to the conventional configuration, where 's' is the number of system memory channels implemented in the PoP apparatus 100.

For example, compared to currently available semiconductor packages that accommodate two system memory channels with two ZQ balls at the bottom conductive interface of a PoP apparatus, aspects of the present disclosure reduce the number of ZQ balls at the bottom conductive interface to one for accommodating two system memory channels. In one example, according to aspects of the present disclosure semiconductor packages for mobile devices may allocate the shared external ZQ resistor 108, on a system PCB 112 and one shared ZQ balls at the shared bottom conductive interface 110 of the bottom package 114 to accommodate the first ZQ calibration path 104 and the second ZQ calibration path 106 for both of the first system memory channel 220 and the second system memory channel 222.

The number of ZQ balls at the top conductive interface 103, 105 of a bottom package 114 is unchanged compared to the currently available semiconductor packages. Because the number of top conductive interface 103, 105 is unchanged, the PoP apparatus 100 can be implemented without altering the design of a top package 102 and without altering DRAM die design.

According to aspects of the present disclosure, in a multi-channel system, a first memory controller 230 and a second memory controller 232 for each of the first system memory channel 220 and the second system memory channel 222 is coupled to the arbitration circuitry 218. The arbitration circuitry 218 may be integrated processor circuitry in the bottom package 114, for example. The first memory controller 230 and the second memory controller 232 are configured to communicate with the arbitration circuitry 218 to request access to the shared external ZQ resistor 108 before performing a ZQ calibration. Whenever the second memory controller 232 requests use of a shared external ZQ resistor 108 while the shared external ZQ resistor 108 is being used to calibrate DRAM on a first system memory channel 220, the second memory controller 232 is configured to delay its request until the shared external ZQ resistor 108 is free. The delay time during which the second memory controller 232 waits for access to the shared external ZQ resistor 108 is generally very small, and may be in the order of, for example, hundreds of nanoseconds.

According to aspects of the present disclosure, each of the first memory controller 230 and the second memory controller 232 periodically issues ZQ commands to the memory to calibrate using the shared external ZQ resistor 108. In one example, each of the first memory controller 230 and the second memory controller 232 may issue a ZQ command about every 256 milliseconds. The duration of each access to the shared external ZQ resistor 108 for ZQ calibration of a single system memory channel is about 200 nanoseconds. According to aspects of the present disclosure, the arbitration circuitry 218 is integrated with processor circuitry in the bottom package 114 of a PoP apparatus 100. The arbitration circuitry 218 is configured to prevent overlapping ZQ commands from the first memory controller 230 and the second memory controller 232 to memory so that physical resistors can be shared among channels.

According to aspects of the present disclosure, the first memory controller 230 and the second memory controller 232 may be configured to perform the disclosed delay calibration process continuously without having to interrupt other processing tasks and without switching back and forth between the disclosed delay calibration process and other processing tasks.

Figure 3:
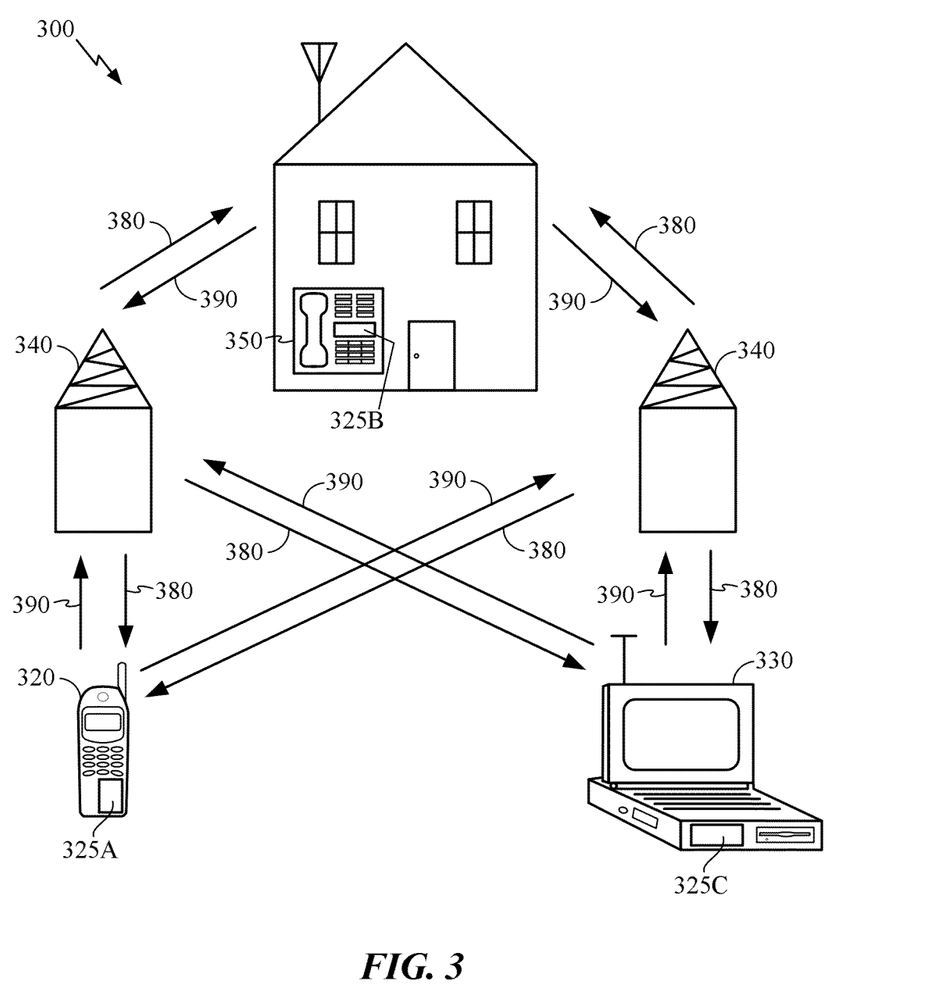
FIG. 3 shows an exemplary wireless communication system in which a configuration of the disclosure may be advantageously employed.

FIG. 3 shows an exemplary wireless communication system 300 in which a configuration of the disclosed calibration method may be advantageously employed. For purposes of illustration, FIG. 3 shows three remote units 320, 330, and 350 and two of the base stations 340. It will be recognized that wireless communication systems may have many more remote units and base stations. Remote units 320, 330, and 350 include the calibration circuitry 325A, 325B, and 325C, respectively. FIG. 3 shows forward link signals 380 from the base stations 340 and the remote units 320, 330, and 350 and reverse link signals 390 from the remote units 320, 330, and 350 to base stations 340.

In FIG. 3, the remote unit 320 is shown as a mobile telephone, remote unit 330 is shown as a portable computer, and remote unit 350 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 3 illustrates remote units, which may employ calibration circuitry according to the teachings of the disclosure, the disclosure is not limited to these exemplary illustrated units. For instance, calibration circuitry according to configurations of the present disclosure may be suitably employed in any device.

Figure 4:
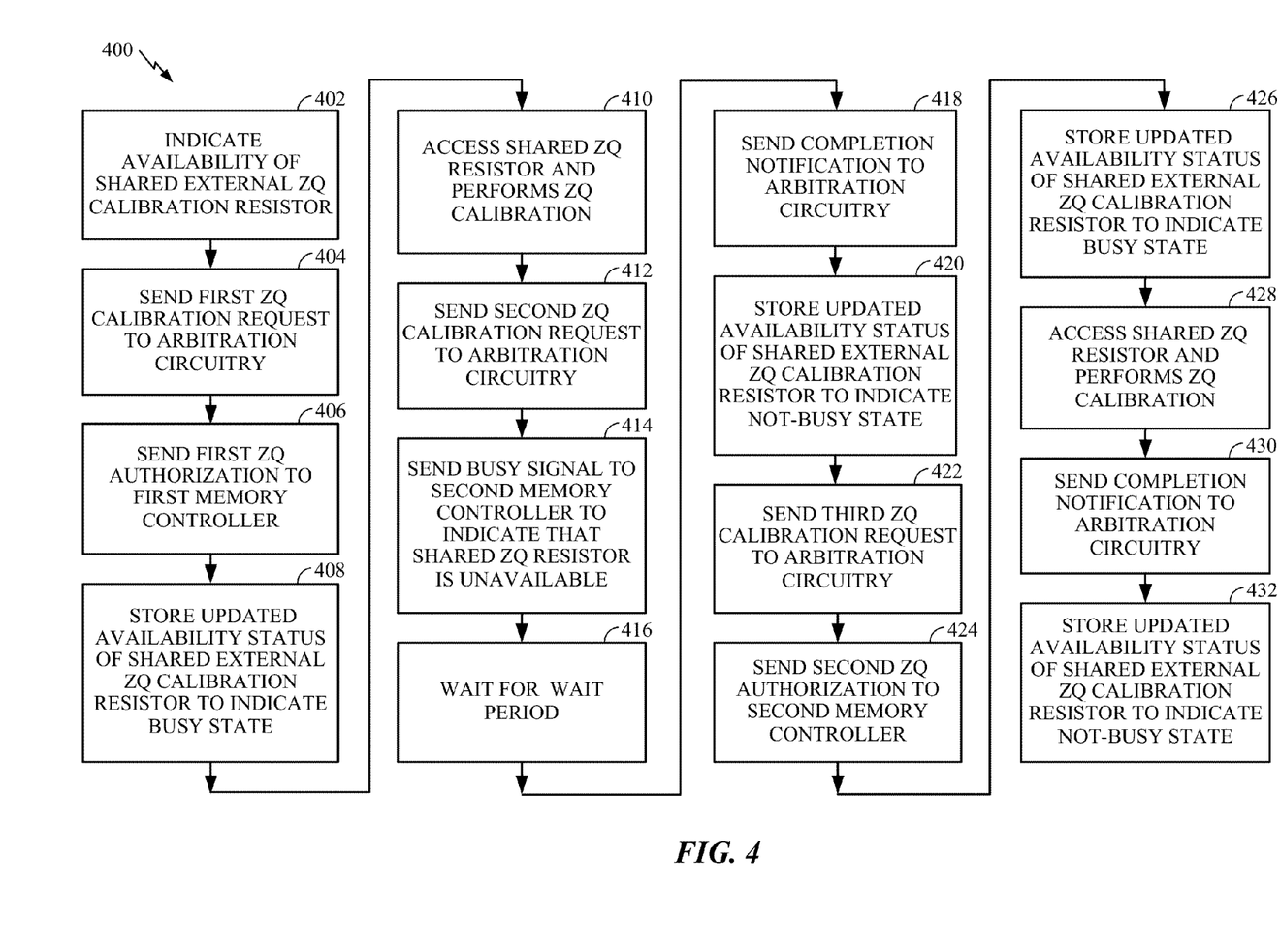
FIG. 4 is a process flow diagram illustrating a method for arbitration of a shared ZQ calibration path according to an aspect of the present disclosure.

FIG. 4 is a process flow diagram 400 illustrating arbitration of a shared ZQ calibration path according to an aspect of the present disclosure. At block 402, an arbitration controller indicates availability of a shared external ZQ calibration resistor. At block 404 a first memory controller sends a first ZQ calibration request to the arbitration circuitry. If the shared ZQ resistor is available when the arbitration circuitry receives the first ZQ calibration request, at block 406, the arbitration circuitry sends a first ZQ authorization to the first memory controller. At block 408, the arbitration circuitry stores an updated availability status of the shared external ZQ calibration resistor to indicate a busy state. When the first memory controller receives the first ZQ authorization request from the arbitration circuitry, the first memory controller accesses the shared ZQ resistor and performs a ZQ calibration at block 410.

At block 412, a second memory controller sends a second ZQ calibration request to the arbitration circuitry. When the arbitration circuitry receives the second ZQ calibration request while the availability of status of the external ZQ calibration resistor indicates a busy state, at block 414, the arbitration circuitry sends a busy signal to the second memory controller indicating that the shared ZQ resistor is unavailable. At block 416, when the second memory controller receives the busy signal, it waits for a wait period. The wait period may be predetermined or may be a dynamically determined wait period that is based on priorities of other tasks or other factors, for example. At block 418, when the first memory controller completes its ZQ calibration process, the first memory controller sends a completion notification to the arbitration circuitry. At block 420, when the arbitration circuitry receives the completion notification, the arbitration circuitry stores an updated availability status of the shared external ZQ calibration resistor to indicate a not-busy state.

At block 422, when the wait period elapses, the second memory controller sends a third ZQ calibration request to the arbitration circuitry. Because the shared ZQ resistor is available when the arbitration circuitry receives the third ZQ calibration request, at block 424, the arbitration circuitry sends a second ZQ authorization to the second memory controller. At block 426, the arbitration circuitry stores an updated availability status of the shared external ZQ calibration resistor to indicate a busy state. When the second memory controller receives the first ZQ authorization request from the arbitration circuitry, the second memory controller accesses the shared ZQ resistor and performs a ZQ calibration at block 428.

At block 430, when the second memory controller completes its ZQ calibration process, the second memory controller sends a completion notification to the arbitration circuitry. At block 432, when the arbitration circuitry receives the completion notification, the arbitration circuitry stores an updated availability status of the shared external ZQ calibration resistor to indicate a not-busy state.

Figure 5:
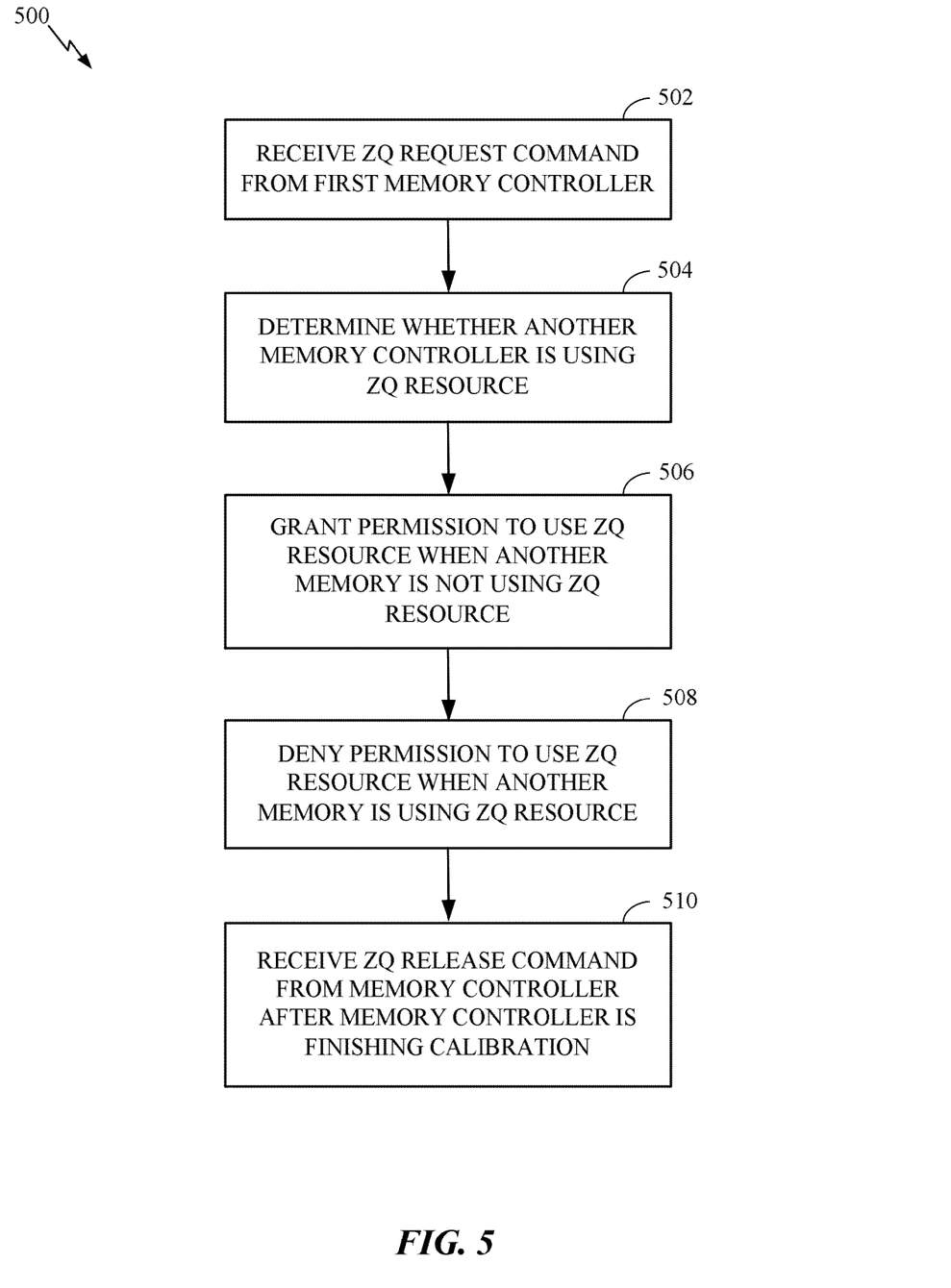
FIG. 5 is a process flow diagram illustrating method for sharing calibration circuitry in a PoP device according to aspects of the present disclosure.

A method for sharing calibration circuitry in a PoP device according to aspects of the present disclosure is described with reference to the flow diagram 500 of FIG. 5. At block 502, the method includes receiving a ZQ request command from a first memory controller. At block 504, the method includes determining whether another memory controller is using the ZQ resource. At block 506, the method includes granting permission to use the ZQ resource when another memory is not using the ZQ resource. At block 508, the method includes denying permission to use the ZQ resource when another memory is using the ZQ resource. At block 510, the method includes receiving a ZQ release command from the memory controller after the memory controller is finished calibration.

According to another aspect of the present disclosure, a semiconductor package on package (PoP) apparatus includes a first package containing a first memory controller and a second memory controller. A second package coupled to the first package contains a first system memory channel and a second system memory channel. A calibration resistor is coupled to the first memory channel and the second memory channel via a conductive path through the first package. According to this aspect of the disclosure, the apparatus also includes means for preventing calibration signals of the first memory controller from overlapping calibration signals of the second memory controller. Referring to FIG. 2, the means for preventing calibration signals of the first memory controller from overlapping calibration signals of the second memory controller may include arbitration circuitry 218 in the bottom package 114 coupled to the first memory controller 230 and the second memory controller 232 as described above with reference to FIG. 2, for example. Alternatively means for preventing calibration signals of the first memory controller from overlapping calibration signals of the second memory controller may be arbitration circuitry configured within the first memory controller 230 and/or within the second memory controller 232, for example. The means for preventing calibration signals of the first memory controller from overlapping calibration signals of the second memory controller may be arbitration circuitry configured within the bottom package 114, for example. In another aspect, the aforementioned means may be any module or any apparatus configured to perform the functions recited by the aforementioned means.

Although specific circuitry has been set forth, it will be appreciated by those skilled in the art that not all of the disclosed circuitry is required to practice the disclosed configurations. Moreover, certain well known circuits have not been described, to maintain focus on the disclosure.

Figure 6:
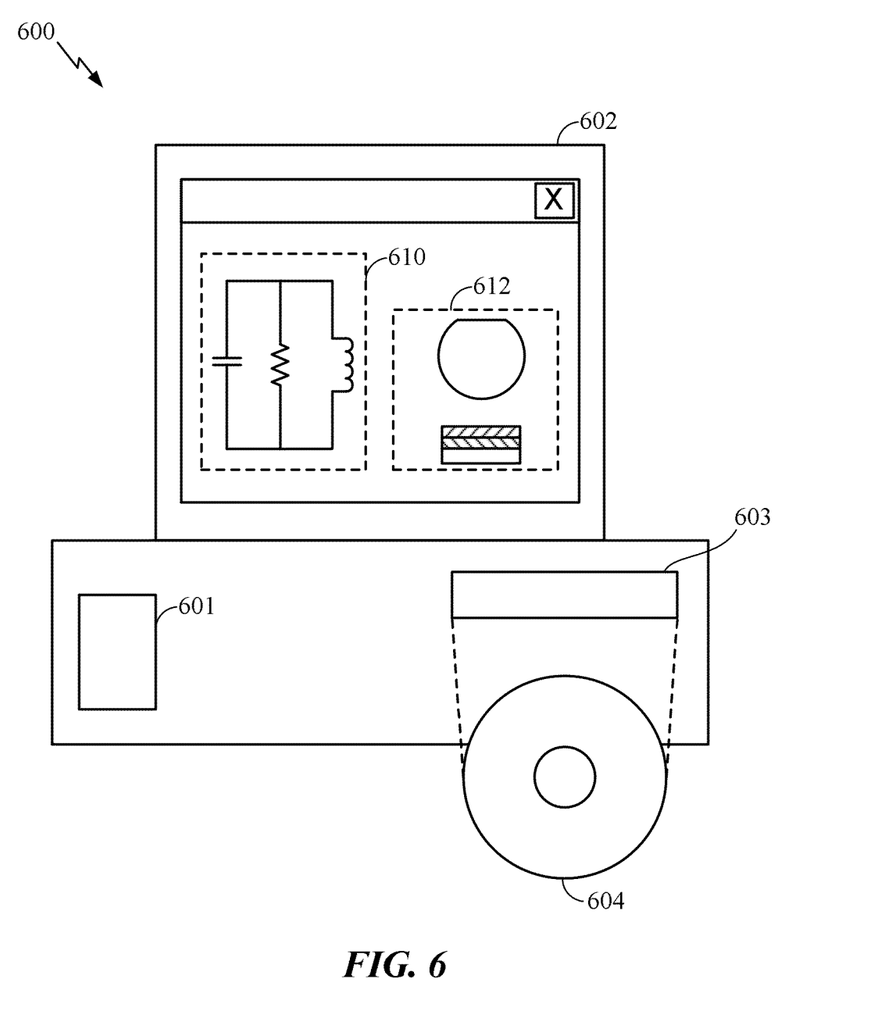
FIG. 6 is a block diagram illustrating a design workstation for circuit, layout, and logic design of a semiconductor component according to one aspect of the present disclosure.

FIG. 6 is a block diagram illustrating a design workstation used for circuit, layout, and logic design of a semiconductor component, such as the calibration circuitry disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as the calibration circuitry. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A semiconductor package on package (PoP) apparatus, comprising:
   a first package including a first memory controller and a second memory controller;
   a second package coupled to the first package, the second package including a first system memory channel and a second system memory channel;
   a calibration resistor coupled to the first system memory channel and the second system memory channel via a conductive path through the first package; and
   arbitration circuitry on the first package coupled to the first memory controller and the second memory controller, the arbitration circuitry configured to prevent calibration signals of the first memory controller from overlapping with the calibration signals of the second memory controller.

2. The apparatus of claim 1, further comprising processor circuitry integrated with the arbitration circuitry on the first package.

3. The apparatus of claim 1, further comprising a system circuit board coupled to the first package and the calibration resistor, in which the calibration resistor is on the system circuit board and external to the first package and the second package.

4. The apparatus of claim 3, further comprising:
   the first system memory channel coupled between the first memory controller and the second package;
   the second system memory channel coupled between the second memory controller and the second package; and
   a shared calibration path coupled between the first package and the calibration resistor via the system circuit board.

5. The apparatus of claim 4, integrated in a mobile phone, a set top box, a music player, a video player, an entertainment unit, a navigation device, a computer, a hand-held personal communication systems (PCS) unit, a portable data unit, and/or a fixed location data unit.

6. A method for sharing calibration circuitry in a package on package (PoP) device, the method comprising:
   receiving a ZQ request command from a first memory controller;
   determining whether another memory controller is using a ZQ resource;
   granting permission to use the ZQ resource when the another memory controller is not using the ZQ resource; and
   denying the permission to use the ZQ resource when the another memory controller is using the ZQ resource.

7. The method of claim 6, further comprising updating an availability status indicator to indicate that the ZQ resource is busy after granting of the permission to use the ZQ resource.

8. The method of claim 7, further comprising receiving a ZQ release command from the another memory controller after the another memory controller is finished calibration.

9. The method of claim 8, further comprising updating the availability status indicator to indicate that the ZQ resource is available after receiving the ZQ release command.

10. The method of claim 9, further comprising accessing the availability status indicator to determine whether the ZQ resource is available in response to receiving the ZQ request command.

11. The method of claim 9, further comprising integrating the PoP device into a mobile phone, a set top box, a music player, a video player, an entertainment unit, a navigation device, a computer, a hand-held personal communication systems (PCS) unit, a portable data unit, and/or a fixed location data unit.

12. A semiconductor package on package (PoP) apparatus, comprising:
   a first package including a first memory controller and a second memory controller;
   a second package coupled to the first package, the second package including a first system memory channel and a second system memory channel;
   a calibration resistor coupled to the first system memory channel and the second system memory channel via a conductive path through the first package; and
   means for preventing calibration signals of the first memory controller from overlapping with calibration signals of the second memory controller.

13. The apparatus of claim 12, in which the preventing means comprises arbitration circuitry on the first package coupled to the first memory controller and the second memory controller.

14. The apparatus of claim 13, further comprising processor circuitry integrated with the arbitration circuitry on the first package.

15. The apparatus of claim 12, further comprising a system circuit board coupled to the first package and the calibration resistor, in which the calibration resistor is on the system circuit board and external to the first package and the second package.

16. The apparatus of claim 15, further comprising:
the first system memory channel coupled between the first memory controller and the second package;
the second system memory channel coupled between the second memory controller and the second package; and
a shared calibration path coupled between the first package and the calibration resistor via the system circuit board.

17. The apparatus of claim 12, integrated in a mobile phone, a set top box, a music player, a video player, an entertainment unit, a navigation device, a computer, a hand-held personal communication systems (PCS) unit, a portable data unit, and/or a fixed location data unit.

18. A computer program product for wireless communications in a wireless network, comprising:
a non-transitory computer-readable medium having program code recorded thereon, the program code comprising:
program code to receive a ZQ request command from a first memory controller;
program code to determine whether another memory controller is using a ZQ resource;
program code to grant permission to use the ZQ resource when the another memory controller is not using the ZQ resource; and
program code to deny the permission to use the ZQ resource when the another memory controller is using the ZQ resource.

19. The computer program product of claim 18, in which the program code further comprises program code to receive a ZQ release command from the another memory controller after the another memory controller is finished calibration.

20. The computer program product of claim 18, integrated in a mobile phone, a set top box, a music player, a video player, an entertainment unit, a navigation device, a computer, a hand-held personal communication systems (PCS) unit, a portable data unit, and/or a fixed location data unit.

* * * * *